(12) United States Patent
Takinami et al.

(10) Patent No.: US 7,949,316 B2
(45) Date of Patent: May 24, 2011

(54) HIGH-EFFICIENCY ENVELOPE TRACKING SYSTEMS AND METHODS FOR RADIO FREQUENCY POWER AMPLIFIERS

(75) Inventors: Koji Takinami, Saratoga, CA (US); Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 770 days.

(21) Appl. No.: 12/022,141

(22) Filed: Jan. 29, 2008

(65) Prior Publication Data

US 2009/0191826 A1 Jul. 30, 2009

(51) Int. Cl.
*H01Q 11/12* (2006.01)
*H04B 1/04* (2006.01)

(52) U.S. Cl. ...................... 455/127.1; 455/108

(58) Field of Classification Search .............. 455/127.1, 455/127.2, 108; 330/127, 199; 375/295, 375/300; 332/149
See application file for complete search history.

(56) References Cited

U.S. PATENT DOCUMENTS

| | | | |
|---|---|---|---|
| 6,348,781 B1 * | 2/2002 | Midya et al. ............... | 323/224 |
| 6,377,784 B2 | 4/2002 | McCune | |
| 6,661,210 B2 | 12/2003 | Kimball et al. | |
| 6,864,668 B1 | 3/2005 | McCune et al. | |
| 7,038,536 B2 | 5/2006 | Cioffi et al. | |
| 7,058,373 B2 | 6/2006 | Grigore | |
| 2008/0003950 A1 * | 1/2008 | Haapoja et al. ............... | 455/73 |

OTHER PUBLICATIONS

F. Wang et al., "An Improved Power-Added Efficiency 19-dBm Hybrid Envelope Elimination and Restoration Power Amplifier for 802.11g WLAN Applications," IEEE Transactions on Microwave Theory and Techniques, Dec. 2006, pp. 4086-4099, vol. 54, issue 12.
F. Wang et al., "Envelope tracking power amplifier with pre-distortion linearization for WLAN 802.11g," 2004 IEEE MTT-S International Microwave Symposium Digest, Jun. 2004, pp. 1543-1546, vol. 3.

* cited by examiner

*Primary Examiner* — Nguyen Vo

(57) ABSTRACT

Envelope tracking (ET) methods and systems for controlling the delivery of power to radio frequency power amplifiers (RFPAs). An exemplary ET system includes an RFPA and a wide bandwidth capable and power efficient envelope modulator that includes a first power supplying apparatus and a second power supplying apparatus. The first power supplying apparatus includes a switch-mode converter and a regulator. The first mode converter is operable to dynamically step down a fixed power supply voltage according to amplitude variations in an envelope signal received by the regulator, and use the resulting dynamic power supply signal to power the regulator. The second power supplying apparatus is connected in parallel with the first power supplying apparatus. Depending on a power of an output signal to be generated at an output of the power amplifier, power is supplied to the power amplifier from either or both of the first and second power supplying apparatuses.

5 Claims, 10 Drawing Sheets

Voltage Waveforms

HIGH-EFFICIENCY ENVELOPE TRACKING SYSTEMS AND METHODS FOR RADIO FREQUENCY POWER AMPLIFIERS

FIELD OF THE INVENTION

The present invention relates generally to controlling the delivery of power to radio frequency power amplifiers (RFPAs). More specifically, the present invention relates to high-efficiency envelope tracking (ET) systems and methods for controlling and supplying power to RFPAs.

BACKGROUND OF THE INVENTION

Radio frequency power amplifiers (RFPAs) are used in a wide variety of applications. As illustrated in FIG. 1, an RFPA 100 operates to convert an RF input signal, RFin, having a small amount of energy to an amplified RF output signal, RFout, having a large amount of energy. The energy required to complete this conversion process is provided by a direct current (DC) voltage supply, Vsupply, typically a battery.

The approach to supplying power to the RFPA 100 in FIG. 1 is known as a "fixed drain bias" approach, since the drain of the transistor (typically, a field-effect transistor having a gate, a drain and a source) in the RFPA 100 is directly coupled to the fixed DC voltage supply, Vsupply. Unfortunately, an RFPA powered by a fixed drain bias is not a very efficient converter of power. In fact, the RFPA 100 becomes progressively less efficient the smaller the amplitude of the RF input signal, RFin, is compared to the fixed DC voltage supply, Vsupply. Accordingly, in many applications, and in particular those that use non-constant-envelope signals, the fixed drain bias approach is quite often not a suitable approach to delivering power to an RFPA.

One technique that can be used to improve the efficiency over the efficiencies obtainable can be obtained using a fixed drain bias, is to use what is known as an "envelope tracking" (ET) system, a simplified drawing of which is shown FIG. 2. The ET system 200 comprises an envelope modulator 202 and an RFPA 204. The envelope modulator 202 operates to modulate the power supply voltage, Vsupply, according to an envelope signal, Venv, containing envelope information of the RF input signal, RFin, applied to the RFPA 204. The resulting envelope modulated power supply signal, Vout, is coupled to a power supply input of the RFPA 204. The RFPA 204 then amplifies the RF input signal, RFin, according to the envelope modulated power supply signal, Vout, thereby providing the desired RF output signal, RFout. Because the envelope modulated power supply signal, Vout, tracks the envelope of the RF input signal, RFin, the RFPA 204 is able to operate more efficiently compared to an RFPA with a fixed drain bias.

The envelope modulator 202 in the ET system 200 in FIG. 2 can be implemented in various ways. One approach is to use a linear regulator. A linear regulator, as the name suggests, generates an output signal that is linearly related to the signal applied to its input. Accordingly, when an envelope signal, Venv, is applied to the input of the linear regulator, as shown in FIG. 3, the linear regulator provides an envelope modulated power supply signal, Vout, which linearly tracks the amplitude variations of the envelope signal, Venv.

One attractive characteristic of the linear regulator 300 is that it can react quickly to sudden changes in the envelope signal, Venv. Hence, if used to implement the envelope modulator 202 in the ET system 200 in FIG. 2, the ET system 200 is afforded the ability to operate over a wide bandwidth. Wide bandwidth operation is highly desirable, since many modern communications systems such as, for example, Orthogonal Frequency-Division Multiplexing-based (OFDM-based) 802.11a/g wireless local area networks (or "Wi-Fi" LANs) and Wideband Code Division Multiple Access (W-CDMA) cellular communications systems, use wideband signaling. One significant drawback of the linear regulator, however, is that it is inefficient for input signal amplitudes that are lower than the magnitude of the DC supply voltage, Vsupply. The inefficiency increases as this voltage difference widens.

An alternative converting device, which can be used to implement the envelope modulator 202 in the ET system 200 in FIG. 2, and which is much more efficient than the linear regulator 300 in FIG. 3, is a switch-mode converter. FIG. 4 is a diagram of a typical switch-mode converter 400 (also referred to in the art as a "step-down" converter or a "buck" converter). The switch-mode converter 400 includes a power (or "switching") transistor 402 configured to operate as a switch, an inductor 404, and a capacitor 406. The switching transistor 402 is controlled by a pulse-width modulated switch control signal provided by a comparator 408, which is configured to operate as a pulse-width modulator. The pulse-width modulated switch control signal is a square wave having a duty cycle, D. The duty cycle, D, varies according to changes in the amplitude of the envelope signal, Venv. When the pulse-width modulated switch control signal is applied to the gate of the switching transistor 402, it turns the switching transistor 402 on and off, thereby alternately connecting and disconnecting the inductor 404 to and from the DC supply voltage, Vsupply. The inductor 404 and capacitor 406 operate as a low-pass filter, to filter the inductor current before it is transferred to the load 410. It can be shown that the resulting output voltage signal, Vout, is proportional to the product of the duty cycle, D, and the magnitude of the DC supply voltage, Vsupply. In other words, the resulting output voltage signal, Vout, is an envelope modulated power supply signal that tracks the amplitude variations of the envelope signal, Venv.

While the switch-mode converter 400 in FIG. 4 is capable of generating an envelope modulated power supply signal efficiently, it is slow and noisy. It is noisy due to the switching action of the switching transistor 402. Filtering cannot completely remove the switching noise, and inevitably some amount of switching noise is introduced into the RF output signal, RFout, of the RFPA. This switching noise makes it difficult to satisfy signal to noise ratio requirements required of wireless standards. The switch-mode converter 400 is slow due to the large gate capacitance presented by the large switching transistor. Generating and sourcing large currents requires a transistor with a large gate area. However, a large gate area introduces a large parasitic capacitance (on the order of 1000 pF), which limits the switching speed of the switching transistor 402 to only about 5 MHz or so. Given that accurate envelope tracking requires a switching frequency of twenty to fifty times higher than the required signal envelope bandwidth, and many signal types have a signal envelope bandwidth of 1 MHz or higher, switch-mode converters are not typically well-suited for wide bandwidth ET tracking.

Given the need for an ET system that is both efficient and capable of operating over a wide bandwidth, various techniques have been proposed which combine the high bandwidth and low-noise capabilities of the linear regulator with the high-efficiency capability of the switch-mode converter. FIG. 5 is a drawing of an ET system 500 of one such approach. The ET system 500 comprises an envelope modulator 502, and an RFPA 504. The envelope modulator 502 comprises a linear regulator 506 (similar to the linear regulator 300 shown and described above in connection with FIG. 3), a hysteresis comparator 508, and a buck converter 510 (similar to the buck converter shown and described above in connection with FIG. 4). The hysteresis comparator 508 operates to provide a switch control signal to the switching transistor 512 of the buck converter 510, based on the direction of current flow sensed by a current sense resistor 514. The direction of current flow is determined by whether the linear regulator 506 is sourcing current to the RFPA 504 or is sinking excess current supplied from the buck converter 510. When the buck converter 510 provides too much current required of the RFPA 504, any excess current not needed by the RFPA 504 is sunk by the linear regulator 506. At times when the required instantaneous current required of the RFPA 504 becomes greater than the instantaneous switch current being supplied by the buck converter 510, the extra current needed by the RFPA 504 is sourced to the RFPA 504 by the linear regulator 506.

While the ET system 500 in FIG. 5 is capable of operating over a wide bandwidth, it is less efficient than desired. It would be desirable, therefore, to have ET systems and methods that are capable of tracking wide bandwidth signals and which are more efficient than the ET systems and methods available in the prior art.

BRIEF SUMMARY OF THE INVENTION

Envelope tracking (ET) methods and systems for controlling the delivery of power to radio frequency power amplifiers (RFPAs) are disclosed. An exemplary ET system includes a wide-bandwidth-capable and power-efficient envelope modulator and an RFPA. The envelope modulator comprises a first switch-mode converter, a regulator (e.g., a linear regulator), and a second switch-mode converter. The first switch-mode converter has a power supply input configured to receive a direct current (DC) power supply voltage, a switch control input configured to receive a first switch control signal, and an output configured do provide a dynamic power supply signal. The regulator has an envelope signal input configured to receive an envelope signal, a power supply input configured to receive the dynamic power supply signal generated by the first switch-mode converter, and an output configured to provide current to the RFPA. The second switch-mode converter has a power supply input configured to receive the DC power supply voltage, a switch control input configured to receive a second switch control signal, and an output configured to provide current to the load. According to one aspect of the invention, the first switch control signal applied to the switch control input of the first switch-mode converter has signal characteristics relating to amplitude variations in the envelope signal received by the regulator, and the first-switch mode converter is configured to generate the dynamic power supply signal so that it tracks amplitude variations in the envelope signal. In this manner, the efficiency of the regulator, and therefore the envelope modulator, is significantly improved.

An exemplary method of controlling the supply of current to a power supply input of a power amplifier includes configuring a first power supplying apparatus disposed in a first power supply path so that it is powered by a dynamic power supply signal having a magnitude that changes according to amplitude variations in an envelope signal, and configuring a second power supplying apparatus, which is disposed in a second power supply path coupled in parallel with the first power supply path so that it is powered by a fixed DC power supply voltage. The first and second power supply paths are coupled to a power supply input of the power amplifier. Depending on the power of an output signal to be generated at the output of the power amplifier, either or both of the first and second power supplying apparatuses is (are) configured to supply current to the power supply input of the power amplifier. According to one aspect of the invention, the first power supplying apparatus includes a switch-mode converter that is operable to dynamically step down a fixed power supply voltage so that the dynamic power supply signal used to power the first power supplying apparatus tracks amplitude variations of an envelope modulated power supply signal at the power supply input of the power amplifier.

Further features and advantages of the present invention, as well as the structure and operation of the above-summarized and other exemplary embodiments of the invention, are described in detail below with respect to accompanying drawings, in which like reference numbers are used to indicate identical or functionally similar elements.

DETAILED DESCRIPTION

Figure 6:
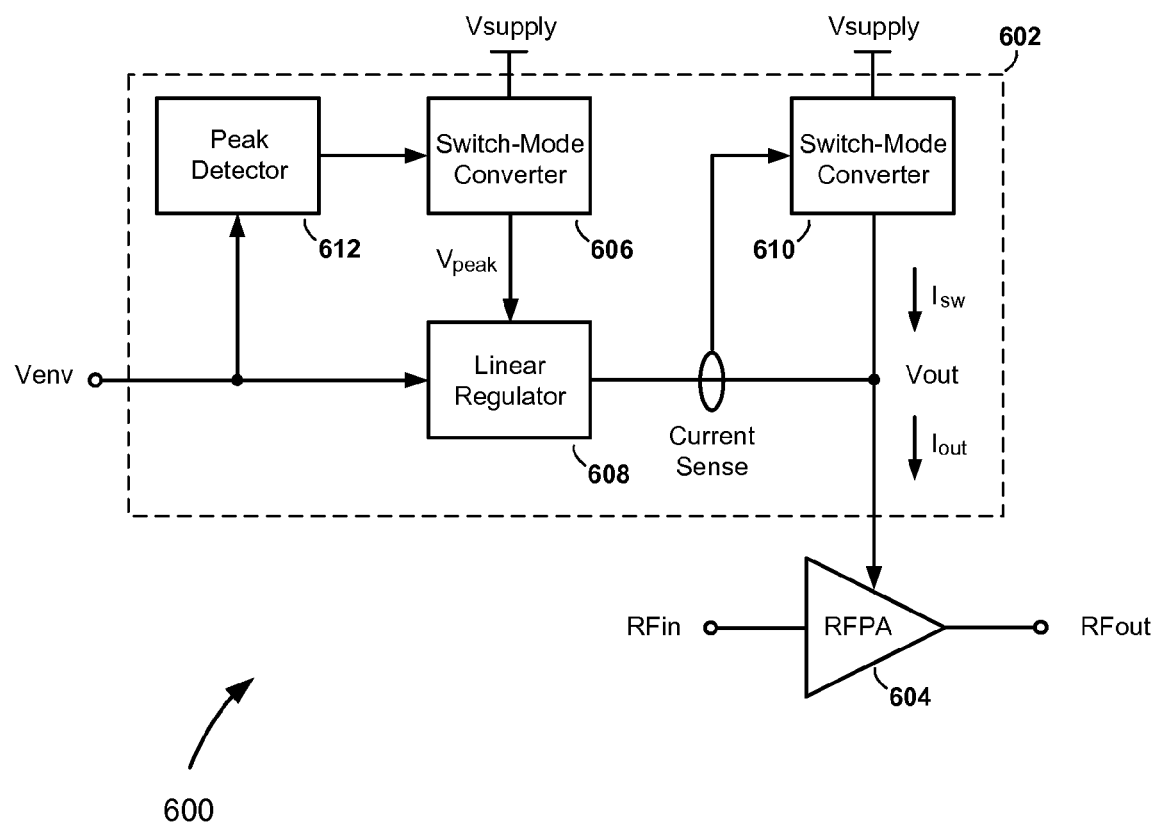
FIG. 6 is a drawing of an exemplary ET system, according to an embodiment of the present invention.

Referring to FIG. 6, there is shown an envelope tracking (ET) system 600, according to an embodiment of the present invention. The ET system 600 comprises an envelope modulator 602 and a radio frequency power amplifier (RFPA) 604. The RFPA 604 includes an RF input, which is configured to receive an RF input signal, RFin, an RF output, which is configured to provide an RF output signal, RFout, and a power supply input, which is configured to receive an envelope modulated power supply signal, Vout, from the envelope modulator 602. The envelope modulator 602 includes a first and second power supply paths, which are connected in parallel between a direct current (DC) power supply voltage, Vsupply, and the power supply input of the RFPA 604. The first power supply path includes a first switch-mode converter (e.g., a buck converter) 606 connected in series with a linear regulator 608. The second power supply path includes a second switch-mode converter 610.

According to an aspect of the invention, the supply voltage, Vsupply, coupled to the power supply input of the first switch-mode converter 606 is modulated by a switch control signal provided by a peak detector 612. The peak detector 612 tracks the peak amplitude of the envelope signal, Venv, and the first switch-mode converter 606 dynamically steps down the supply voltage, Vsupply, to a dynamic power supply signal, Vpeak, that tracks amplitude variations in the envelope signal, Venv. Because the linear regulator 608 functions as a voltage follower, the dynamic power supply signal, Vpeak, also tracks amplitude variations in the envelope modulated power supply signal, Vout, appearing at the output of the envelope modulator 602. The first switch-mode converter 606 dynamically adjusts Vpeak so that it has an amplitude that is higher than the amplitude of the envelope modulated power supply signal, Vout, during times when the linear regulator 608 is configured to deliver power to the RFPA 604. According to one embodiment, the first switch-mode converter 606 also adjusts Vpeak so that its amplitude is no higher than needed to keep the linear regulator 608 operating in its active region for all amplitude levels of the envelope signal, Venv. In this manner, a voltage of only Vpeak−Vout is dropped across the linear regulator 608 (rather than Vsupply−Vout, as in the prior art approach in FIG. 5). The remaining peak-to-supply voltage overhead, $\Delta V = Vsupply - Vpeak$, is dropped across the more efficient first switch-mode converter 606.

Figure 7:
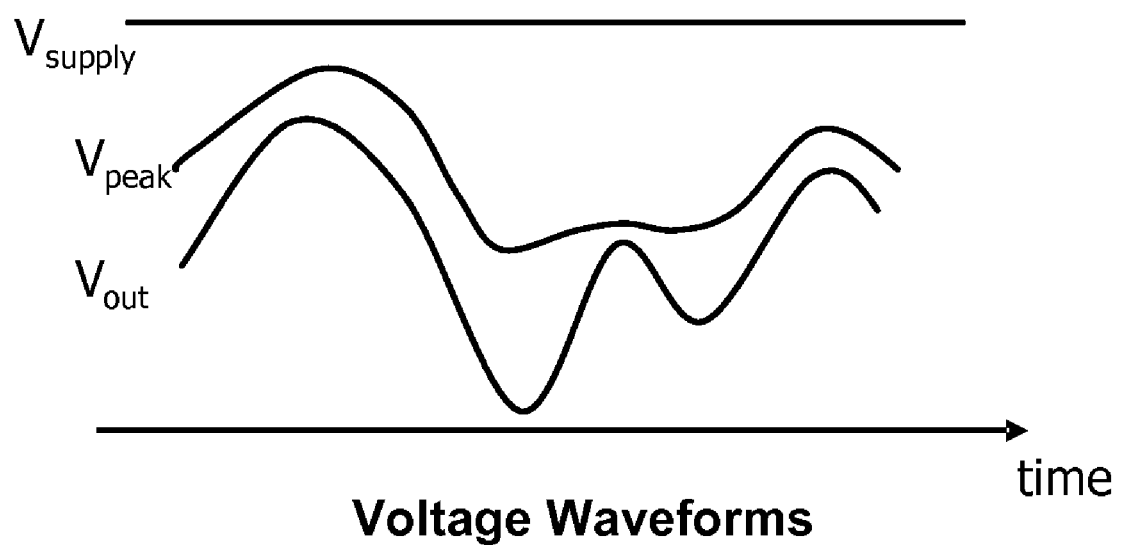
FIG. 7 is a voltage waveform drawing showing the relationship between the power supply voltage, Vsupply, applied to the envelope modulator in the ET system in FIG. 6, the dynamic voltage supply signal, Vpeak generated by the first switch-mode converter of the envelope modulator in the ET system in FIG. 6, and the envelope modulated power supply signal, Vout, at the output of the envelope modulator.

FIG. 7 is a voltage waveform drawing showing the relationship between the power supply voltage, Vsupply, applied to the envelope modulator 602 in the ET system 600 in FIG. 6, the dynamic voltage supply signal, Vpeak, generated by the first switch-mode converter 606, and the envelope modulated power supply signal, Vout, appearing at the output of the envelope modulator 602. Vpeak is seen to generally track Vout. Vpeak does not exactly track Vout during some time intervals in which Vout is changing more quickly than the switching speed capability of the first switch-mode converter 606. Nevertheless, even during those times the peak-to-voltage overhead, $\Delta V = Vsupply - Vpeak$, is dropped across the more efficient first switch-mode converter 606, rather than being wastefully dissipated by the linear regulator 608. Although Vpeak does not exactly track Vout at every instant in time, the term "track" is used in the context of the present invention to refer to general (i.e., both exact and non-exact) tracking of the output envelope (or input envelope) over time.

Figure 8:
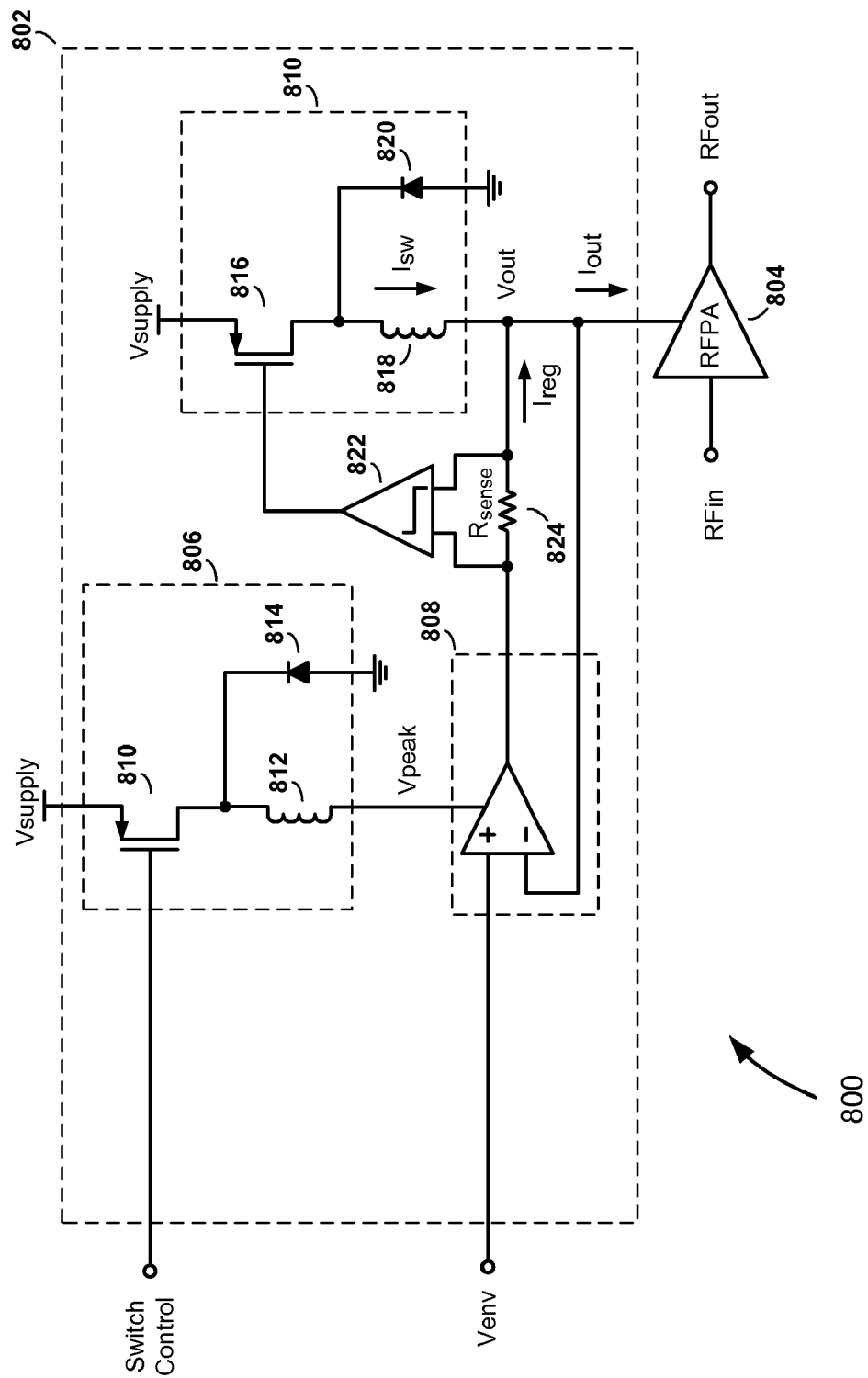
FIG. 8 is a more detailed drawing of an exemplary ET system, according to an embodiment of the present invention.

FIG. 8 is a more detailed drawing of an ET system 800, according to an embodiment of the present invention. The ET system 800 is substantially similar to the ET system 600 shown in FIG. 6, except that it is shown in more detail, and rather than relying on a peak detector 612 to generate a switch control signal based on peaks detected in the envelope waveform, Venv, a switch control signal containing envelope information of the signal to be amplified (e.g., a pulse-width modulated signal generated by an associated baseband processor) is used to control the first switch-mode converter 806.

Like the ET system 600 in FIG. 6, the ET system 800 in FIG. 8 comprises an envelope modulator 802 and an RFPA 804. The envelope modulator 802 includes first and second parallel-connected power supply paths configured between the supply voltage, Vsupply, and the power supply input of the RFPA 804. The first power supply path includes a first switch-mode converter 806 coupled in series with a linear regulator 808. The second power supply path includes a second switch-mode converter 810. The first switch-mode converter 806 comprises a p-type metal oxide semiconductor (p-MOSFET) 810, having a gate, source and drain. The gate of the p-MOSFET 810 is configured to receive the switch control signal from the baseband processor, the drain is coupled to the system power supply voltage, Vsupply, and the source is coupled to a first input terminal of a first inductor 812 and the cathode of the first diode 814. The second terminal of the first inductor 812 is coupled to a power supply input of the linear regulator 808. The anode of the first diode 814 is connected to ground.

The second switch-mode converter 810 in the second power supply path of the envelope modulator 802 comprises a p-MOSFET 816, a second inductor 818 and a second diode 820. The gate of the p-MOSFET 816 is configured to receive a switch control signal from a hysteresis comparator 822, the source is coupled to the system power supply voltage, Vsupply, and the drain is coupled to both a first input terminal of the second inductor 818 and the cathode of the second diode 820. The second terminal of the second inductor 818 is coupled to the power supply input of the RFPA 804. The anode of the second diode 820 is connected to ground.

A current sensing resistor 824, which has a resistance much lower than the load resistance presented by the RFPA 804, is configured within the current supplying path of the linear regulator 808. The terminals of the current sensing resistor 824 are coupled to inputs of the hysteresis comparator 822, which as explained below controls the value of the switch control signal applied to the p-MOSFET 816 of the second switch-mode converter 810.

Figure 9:
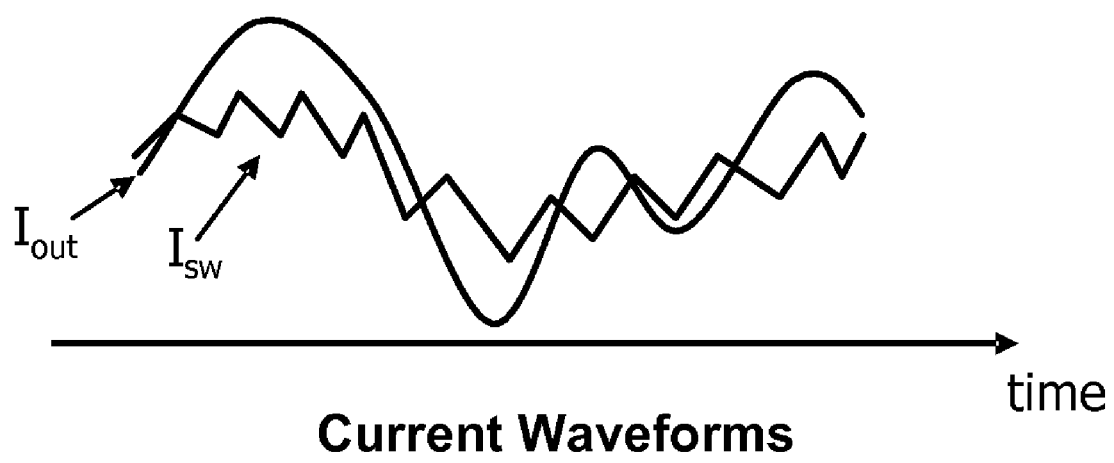
FIG. 9 is a current waveform diagram illustrating how the linear regulator of the switch-mode converter in the ET system in FIG. 8 absorbs switching noise present in a switching current, Isw, generated by the second switch-mode converter, thereby providing a less noisy output current, Iout.

During operation, power needed by the RFPA 804 is generally generated and provided by the second switch-mode converter 810 in the second power supply path of the envelope modulator 802. Specifically, the second switch-mode converter 810 generates a current, Isw, which is supplied to the RFPA 804 to satisfy the RFPA's power needs. As illustrated in FIG. 9, this current will typically contain a fair amount of switching noise. This switching noise is absorbed by the linear regulator 808, thereby resulting in a load current, Iout, that is substantially free of switching noise.

During times when the envelope signal, Venv, is changing abruptly, the linear regulator 808 in the first power supply path is used to supplement the current provided to the RFPA 804. The envelope tracking first switch-mode converter 806 operates to shift the peak-to-supply voltage overhead, $\Delta V = Vsupply - Vpeak$, voltage drop across the more efficient first switch-mode converter 806, as was explained above, thereby improving the efficiency of the linear regulator 808. In addition to operating efficiently, the combined use of the linear regulator 808 in the first power supply path and the second switch-mode converter 810 in the second power supply path afford the ability to use the ET system 800 in wideband applications.

Figure 1:
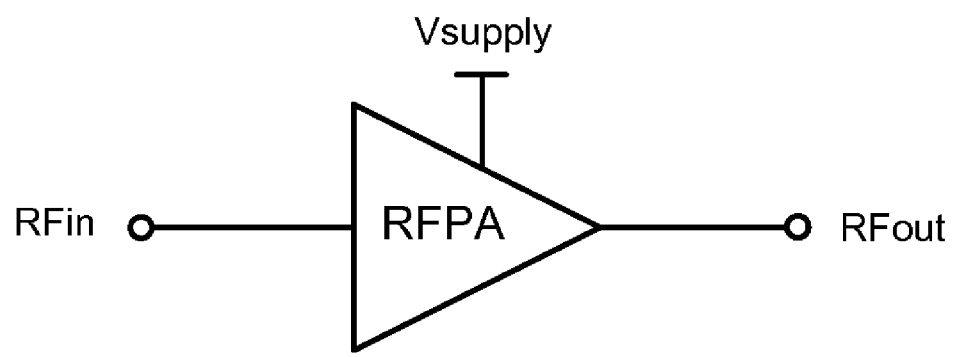
FIG. 1 is a simplified diagram of a radio frequency power amplifier (RFPA)
Figure 2:
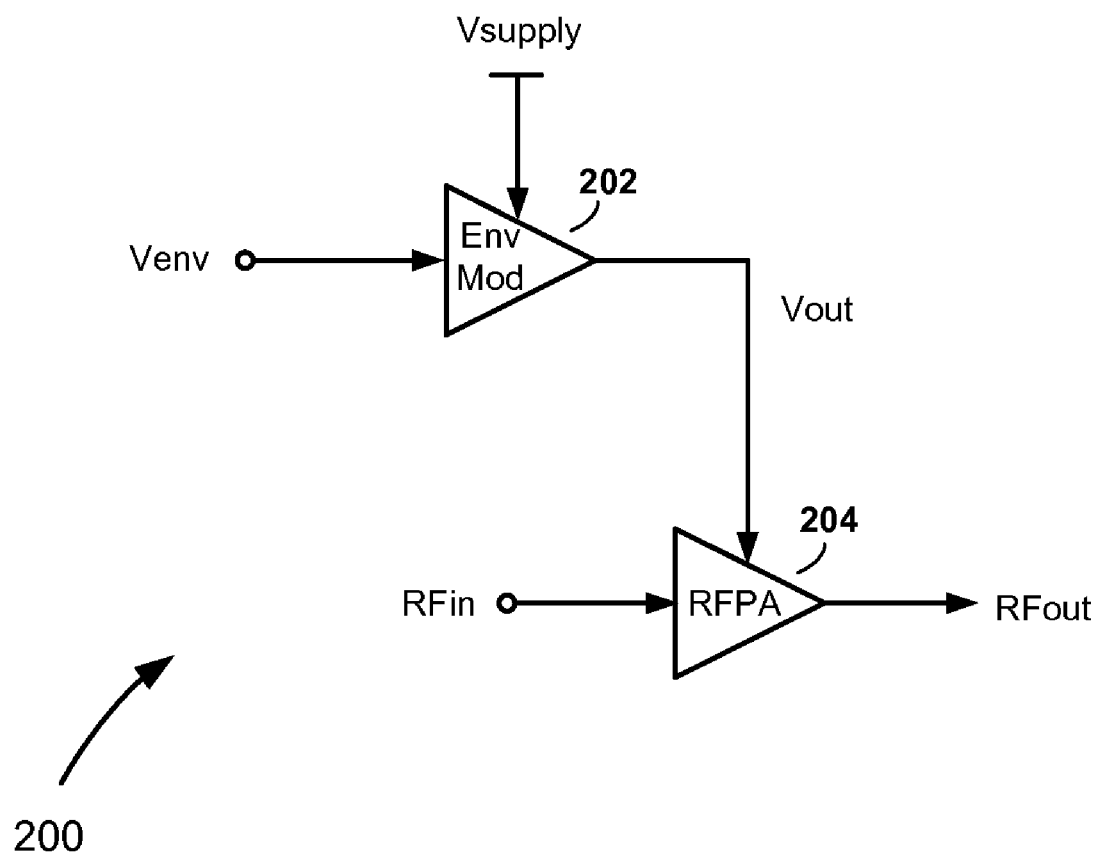
FIG. 2 is a simplified drawing of a conventional envelope tracking (ET) system.
Figure 3:
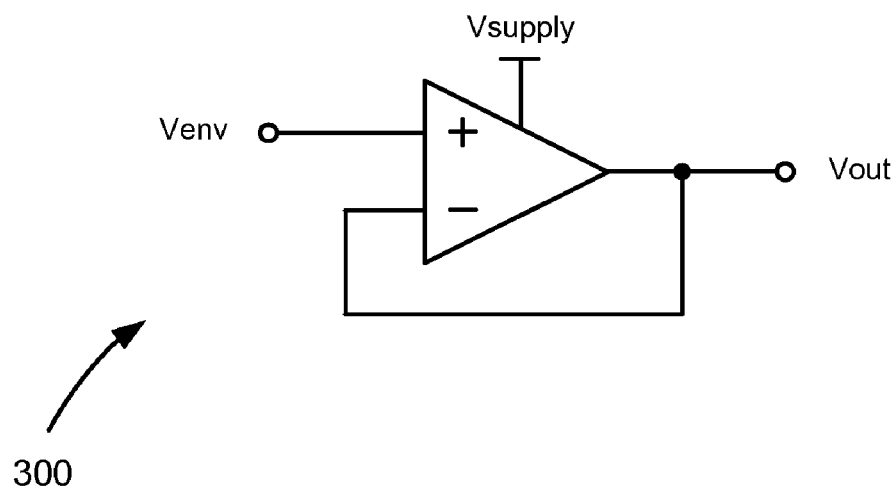
FIG. 3 is simplified diagram of a conventional linear regulator.
Figure 4:
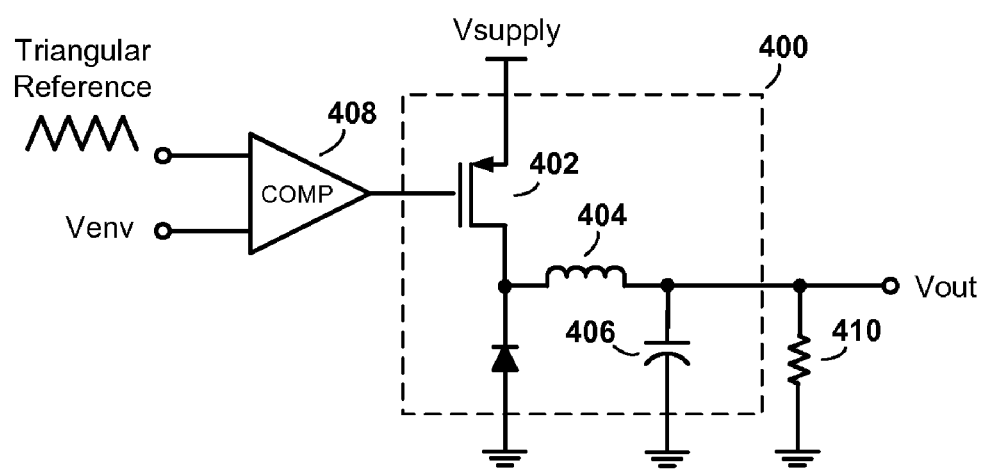
FIG. 4 is a diagram of a conventional buck converter.
Figure 5:
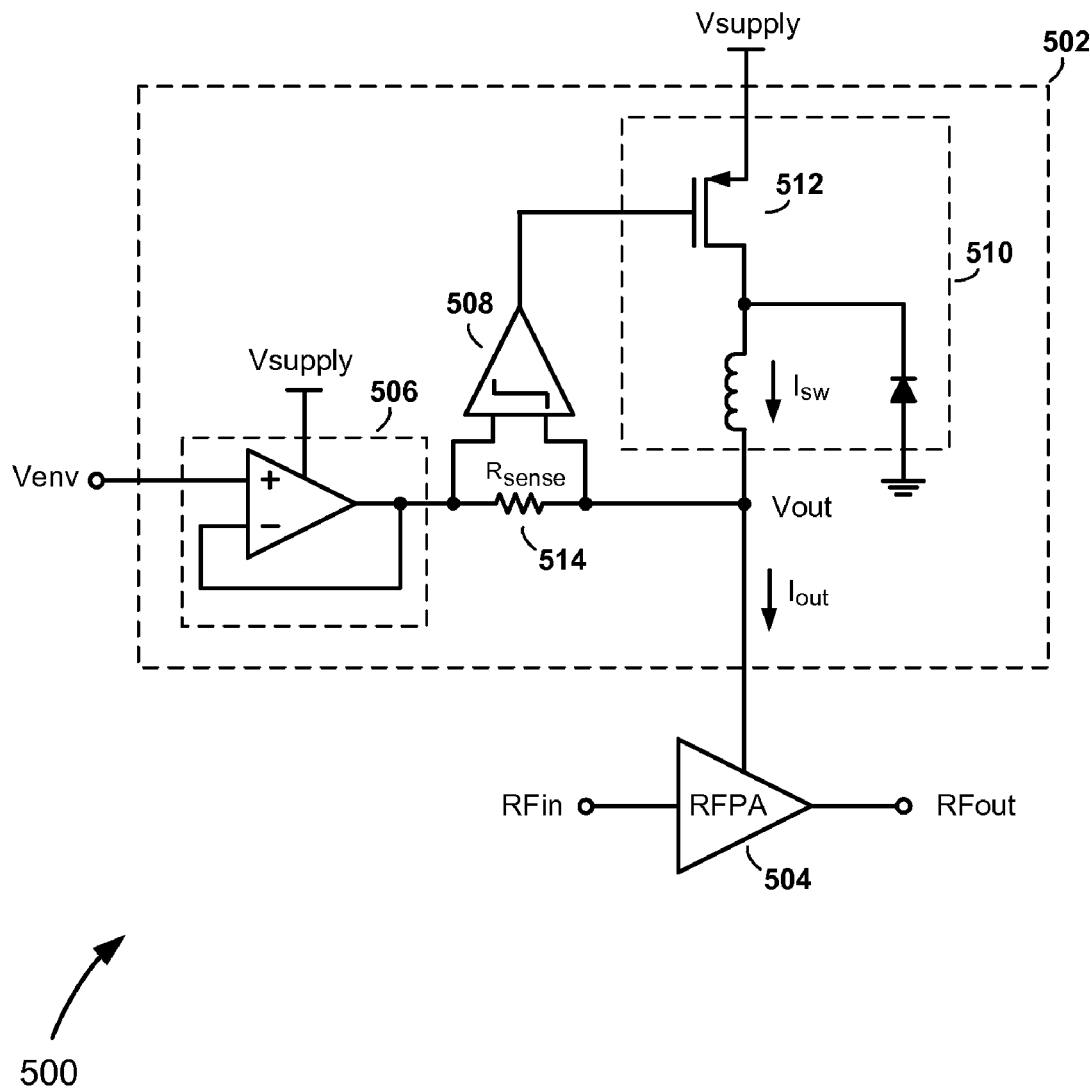
FIG. 5 is a diagram of a known envelope amplifier circuit, which may be used to implement the envelope amplifier in the ET system in FIG. 2.
Figure 10:
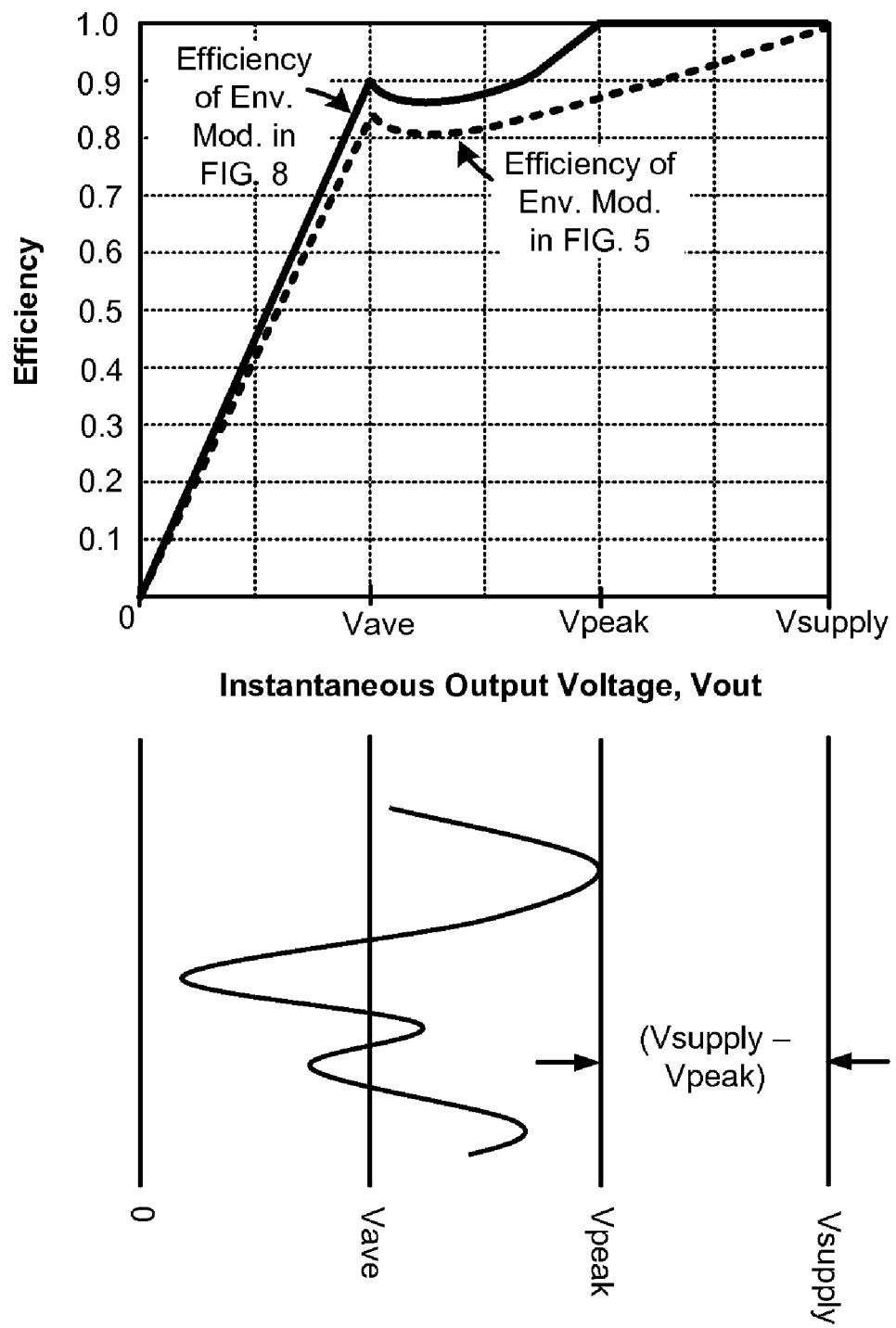
FIG. 10 is a graph comparing the efficiency of the envelope modulator of the ET system in FIG. 8 to the efficiency of the envelope modulator of the prior art ET system in FIG. 5.

FIG. 10 is a graph comparing the instantaneous efficiency of the envelope modulator 802 in the ET system 800 of the present invention to the instantaneous efficiency of the envelope modulator 502 in the ET system 500 in FIG. 5, both as a function of the instantaneous output voltage, Vout. It is assumed that the first switch-mode converter 510 of the ET system 500 and the first and second switch-mode converters 806 and 810 are 100% efficient. It is also assumed, for illustrative purposes, that the switch-mode converters track only DC components. The efficiency curves are based on predictions resulting from mathematical calculations. Therefore, the actual efficiencies and efficiency differences may be scaled somewhat differently than shown. The curves are provided merely to illustrate that the ET system 800 of the present invention is more efficient than the prior art ET system 500 in FIG. 5.

When the instantaneous output voltage of the envelope modulated power supply signal, Vout, (referred to as "the instantaneous output voltage, Vout" below), is equal to an average voltage, Vave, of the envelope modulated power supply signal output signal, Vout (i.e., when Vout=Vave), the current needed by the RFPA 804 of the ET system 800 of the present invention is generated and supplied by the second switch-mode converter 810 in the second power supply path of the envelope modulator 802. The same is true with the prior art system 500 in FIG. 5. FIG. 10 shows that the instantaneous efficiencies of both envelope modulators 502 and 802 are less than ideal (i.e., less than 100%) when Vout=Vave. This is due to the fact that neither of the linear regulators in the envelope modulators 502 and 508 are ideal, and also because the linear regulators are dissipating switching noise present in the switching current, Isw. However, because the linear regulator 808 of the envelope modulator 802 in the ET system 800 of the present invention is able to operate more efficiently (for the reasons discussed above) the efficiency of the envelope modulator 802 of the present invention is higher than the efficiency of the envelope modulator 502 in the ET system 500 FIG. 5 when Vout=Vave.

When the instantaneous output voltage, Vout, at the output of the envelope modulator 802 in the ET system 800 of the present invention drops below the average output voltage, Vave, the instantaneous current being supplied by the envelope modulator 802 to the RFPA 804 is greater than the current needed by the RFPA 804. The excess current is absorbed and dissipated by the linear regulator 808. The current sensing resistor 824 senses the direction of the current flow, and the hysteresis comparator 822 responds accordingly by turning off the p-MOSFET 816 of the second switch-mode converter 810. The second inductor 818 sources whatever current it can to the RFPA 804, once it has been decoupled from the supply voltage, Vsupply. Once the current being supplied to the RFPA 804 settles to the current demanded by the RFPA 804, the current direction through the current sensing resistor 824 reverses and the second switch-mode converter 810 once again is operable to supply most of the current to the RFPA 804. Note that when the instantaneous output voltage, Vout, is less than Vave, the instantaneous efficiency of the envelope modulator 802 decreases the lower the instantaneous output voltage, Vout, is relative to the average output voltage, Vave. This is due to the fact that the linear regulator 808 absorbs more current the lower the instantaneous output voltage, Vout. While this same principle holds true for both the envelope modulator 502 in the ET system in 500 and the ET system of the present invention shown in FIG. 8, the reduction in efficiency is not as great in the ET system of the present invention since the linear regulator 808 is configured to operate more efficiently than is the linear regulator 506 in the prior art system 500 in FIG. 5.

When the instantaneous output voltage, Vout, in the ET system 800 of the present invention rises above the average output voltage, Vave, the instantaneous current being provided to the RFPA 804 from the second switch-mode converter 810 is insufficient to meet the RFPA's power needs. The hysteresis comparator 822 responds to this condition by changing the switch control signal to the p-MOSFET 816 so that the p-MOSFET 816 turns on. Then the current supplied by the second switch-mode converter 810 is supplemented by current supplied by the linear regulator 808 until the current demand of the RFPA 804 is satisfied. The instantaneous efficiency of the envelope modulator 802 of the ET system 800 is higher than the envelope modulator 502 of the prior art ET system 500 in FIG. 5 for all output voltages, Vout, above Vave. Again, this is attributable to the dynamic power control of the linear regulator 808, which avoids unnecessary voltage drops across the linear regulator 808.

Figure 11:
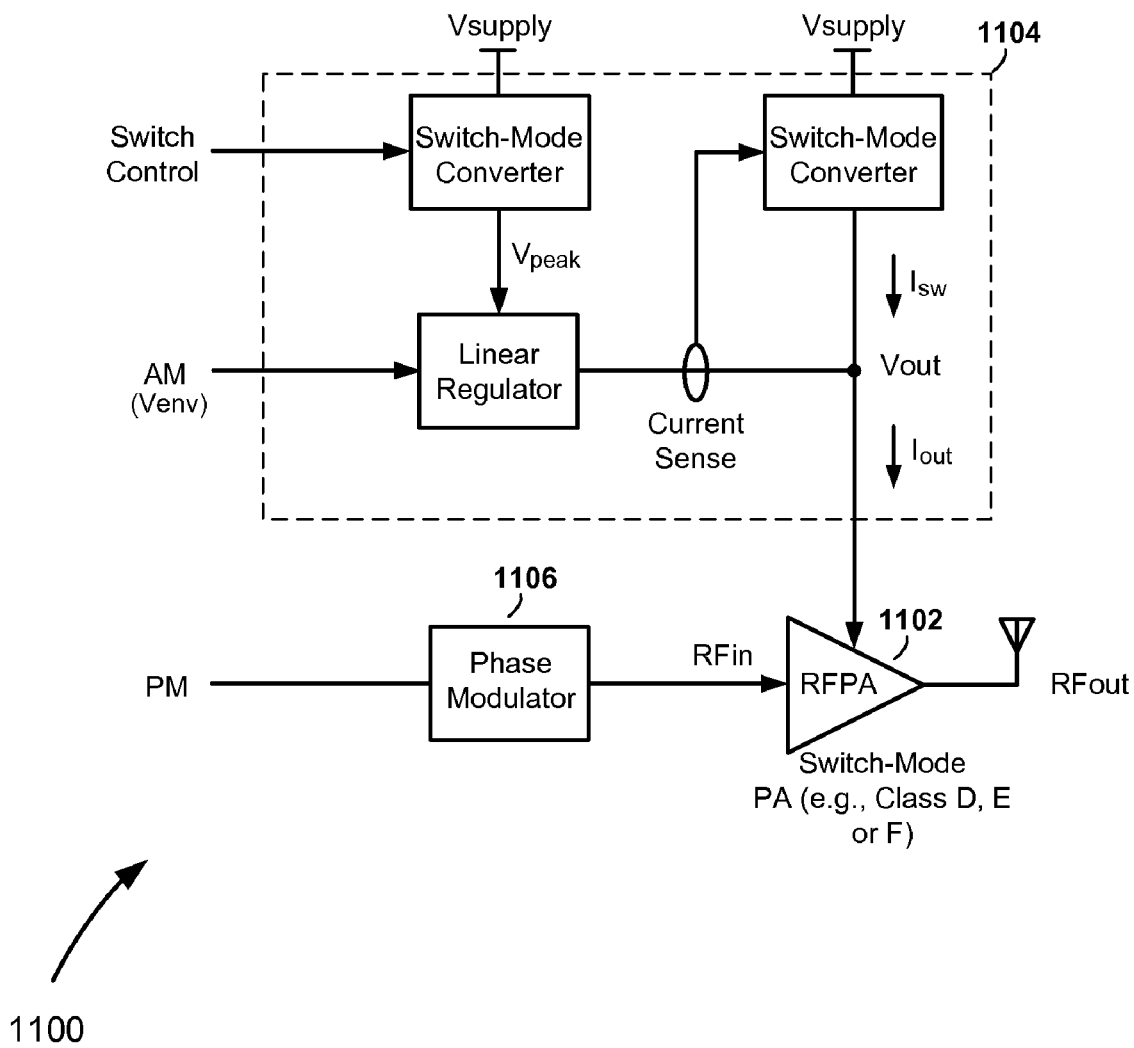
FIG. 11 is a polar transmitter that includes an envelope modulator similar to one of the envelope modulators shown in FIGS. 6 and 8, according to an embodiment of the present invention.

The ET systems and methods of the present invention may be used in a wide variety of envelope tracking applications in which either or both high-efficiency and wide bandwidth operation are desirable. FIG. 11 illustrates, for example, a polar transmitter 1100 having an envelope modulator 1104 similar to one of the envelope modulators 602 and 802 in the ET systems 600 and 800 shown in FIGS. 6 and 8, according to an embodiment of the present invention. The polar transmitter 1100 comprises an RFPA 1102 having an RF input configured to receive a phase modulated RF signal, RFin, from a phase modulator 1106 in a phase path, and a power supply input configured to receive an envelope modulated power supply signal, Vout, from an envelope modulator 1104 in an envelope path. The phase modulator 1106 is operable to phase modulate an RF carrier signal generated by the VCO 1106, according to a phase modulation (PM) signal received from a baseband system (not shown), to generate the phase modulated RF signal, RFin. The envelope modulator 1104 is operable to generate the envelope modulated power supply signal, Vout, based on an amplitude modulation signal (i.e., the envelope modulation signal, Venv) and a switch control signal received from the baseband system, in a manner similar to the envelope modulator 802 shown and described above in FIG. 8. The envelope modulated power supply signal, Vout, appearing at the output of the envelope modulator 1104 is applied to the power supply input of the RFPA 1102 while the phase modulated RF signal, RFin, is applied to the RF input of the RFPA 1102. The RFPA 1102 is configured to operate as a switch-mode amplifier (e.g. a Class-D, E or F power amplifier) in compression. Accordingly, the output power of the resulting phase and envelope modulated RF signal at the output of the RFPA 1102 is directly and dynamically controlled by the envelope modulated power supply signal, Vout, applied to the power supply input of the RFPA 11102.

The present invention has been described with reference to specific exemplary embodiments. These exemplary embodiments are merely illustrative, and not meant to restrict the scope or applicability of the present invention in any way. For example, the ET systems and methods of the present invention may be used to control the delivery of power to either linear or nonlinear RFPAs. In particular, they may be used to control the delivery of power to an RFPA configured to amplify constant envelope signals (e.g., as in an envelope elimination and restoration (ERR) or polar transmitter type of transmitter), or to an RFAP configured to amplify non-constant-envelope signals. In this respect, therefore, the term "envelope tracking" (including its abbreviated form, "ET"), is meant to include within its meaning both EER techniques. Further, while the ET systems and methods of the present invention are well-suited for use in RF cellular communications applications, they may be used on may also be advantageously used in any other application in which the high-efficiency and wideband capabilities of the systems and methods of the invention may be advantageously exploited. For example, they can be used to control the delivery of power in 802.11a or 802.11 g Wi-Fi wireless communications applications and video applications. Still further, the ET systems and methods of the present invention may be employed in microwave frequency applications, and the term "radio fequency" (including it abbreviated form, "RF") is used herein to refer to all radio frequencies in the electromagnetic spectrum, including those radio frequencies that are often referred to in the art as "microwave" frequencies. For at least the foregoing reasons the inventions should not be construed as being limited to any of the specific exemplary embodiment or any particular application. Finally, various modifications or changes to the specific exemplary embodiments will be naturally suggested to those of ordinary skill in the art. Those modifications or changes should also be included, therefore, within the spirit and purview of the appended claims.

What is claimed is:

1. An envelope modulator apparatus for generating a dynamic power supply signal, comprising:
   a first switch-mode converter having a power supply input configured to receive a direct current (DC) power supply voltage, a switch control input configured to receive a first switch control signal, and an output configured to provide a dynamic power supply signal;
   a regulator having an envelope signal input configured to receive an envelope signal, a power supply input configured to receive the dynamic power supply signal from said first switch-mode converter, and an output configured to supply current to a load; and
   a second switch-mode converter having a power supply input configured to receive said DC power supply voltage, a switch control input configured to receive a second switch control signal, and an output configured to provide current to said load.

2. The envelope modulator apparatus of claim 1 wherein said first switch control signal includes signal characteristics relating to amplitude variations in said envelope signal, and the first switch-mode converter is configured to generate said dynamic power supply signal so that it generally tracks amplitude variations in said envelope signal.

3. The envelope modulator apparatus of claim 2 wherein said regulator comprises a linear regulator and said first switch-mode converter is configured to generate said dynamic power supply signal so that at any given time the dynamic power supply signal has a magnitude no higher than necessary to keep the linear regulator operating in its active region.

4. The envelope modulator apparatus of claim 1 wherein the first switch-mode converter and regulator are configured such that when the DC power supply voltage is coupled to the power supply input of said first switch-mode converter an amount of the DC voltage that is dropped across the first switch-mode converter compared to an amount of the DC voltage that is dropped across the regulator is dependent on signal characteristics contained in said first switch control signal.

5. The envelope modulator apparatus of claim 4 wherein the signal characteristics of said first switch control signal include signal characteristics relating to amplitude variations in said envelope signal.

* * * * *